(12) United States Patent
Ooki

(10) Patent No.: US 12,087,796 B2
(45) Date of Patent: Sep. 10, 2024

(54) IMAGING DEVICE

(71) Applicant: SONY SEMICONDUCTOR SOLUTIONS CORPORATION, Kanagawa (JP)

(72) Inventor: Susumu Ooki, Kanagawa (JP)

(73) Assignee: Sony SemiConductor Solutions Corporation, Kanagawa (JP)

( * ) Notice: Subject to any disclaimer, the term of this patent is extended or adjusted under 35 U.S.C. 154(b) by 1016 days.

(21) Appl. No.: 16/976,895

(22) PCT Filed: Feb. 8, 2019

(86) PCT No.: PCT/JP2019/004673
§ 371 (c)(1),
(2) Date: Dec. 14, 2020

(87) PCT Pub. No.: WO2019/171879
PCT Pub. Date: Sep. 12, 2019

(65) Prior Publication Data
US 2021/0111213 A1    Apr. 15, 2021

(30) Foreign Application Priority Data
Mar. 8, 2018 (JP) ................. 2018-041954

(51) Int. Cl.
*H01L 27/146* (2006.01)
(52) U.S. Cl.
CPC .. *H01L 27/14636* (2013.01); *H01L 27/14618* (2013.01)
(58) Field of Classification Search
CPC ......... H01L 27/14618; H01L 27/14636; H01L 23/60
See application file for complete search history.

(56) References Cited

U.S. PATENT DOCUMENTS

2013/0009321 A1    1/2013    Kagawa et al.
2013/0016035 A1    1/2013    Ikeda
(Continued)

FOREIGN PATENT DOCUMENTS

CN    101192620 A    6/2008
CN    102169870 A    8/2011
(Continued)

OTHER PUBLICATIONS

International Search Report and Written Opinion of PCT Application No. PCT/JP2019/004673, issued on Apr. 9, 2019, 08 pages of ISRWO.

*Primary Examiner* — Calvin Y Choi
(74) *Attorney, Agent, or Firm* — CHIP LAW GROUP

(57) ABSTRACT

An imaging device including: pixel area and a peripheral area that lies outside the pixel area; light receiving element provided in the pixel area; circuit board provided in the pixel area and the peripheral area, the circuit board including a semiconductor substrate and a multilayer wiring layer, the multilayer wiring layer being provided between the semiconductor substrate and the light receiving element; first wiring line provided in the multilayer wiring layer, the first wiring line being electrically coupled to the light receiving element; a protective member that is opposed to the circuit board, the protective member and the circuit board sandwiching the light receiving element; and an extended wiring section provided between the semiconductor substrate and the protective member in the peripheral area, one end of the extended wiring section being open and another end of the extended wiring section being electrically coupled to the first wiring line.

9 Claims, 14 Drawing Sheets

(56) References Cited

U.S. PATENT DOCUMENTS

| | | | |
|---|---|---|---|
| 2014/0151838 A1* | 6/2014 | Iizuka | H01L 27/1462 438/66 |
| 2014/0362267 A1 | 12/2014 | Kagawa et al. | |
| 2015/0270212 A1 | 9/2015 | Kagawa et al. | |
| 2016/0343762 A1 | 11/2016 | Kagawa et al. | |
| 2016/0343763 A1 | 11/2016 | Kagawa et al. | |
| 2018/0277585 A1 | 9/2018 | Kagawa et al. | |
| 2019/0006331 A1* | 1/2019 | Khalaf | H01L 25/50 |
| 2020/0321386 A1* | 10/2020 | Manda | H04N 25/70 |

FOREIGN PATENT DOCUMENTS

| | | |
|---|---|---|
| CN | 102867836 A | 1/2013 |
| CN | 102867847 A | 1/2013 |
| CN | 104380465 A | 2/2015 |
| CN | 106057840 A | 10/2016 |
| CN | 107251225 A | 10/2017 |
| JP | 2003-203913 A | 7/2003 |
| JP | 2009-015862 A | 1/2009 |
| JP | 2013-033900 A | 2/2013 |
| JP | 2013-089871 A | 5/2013 |
| KR | 10-2013-0007972 A | 1/2013 |
| TW | 201304064 A | 1/2013 |
| WO | WO-2011116268 A1 | 9/2011 |

\* cited by examiner

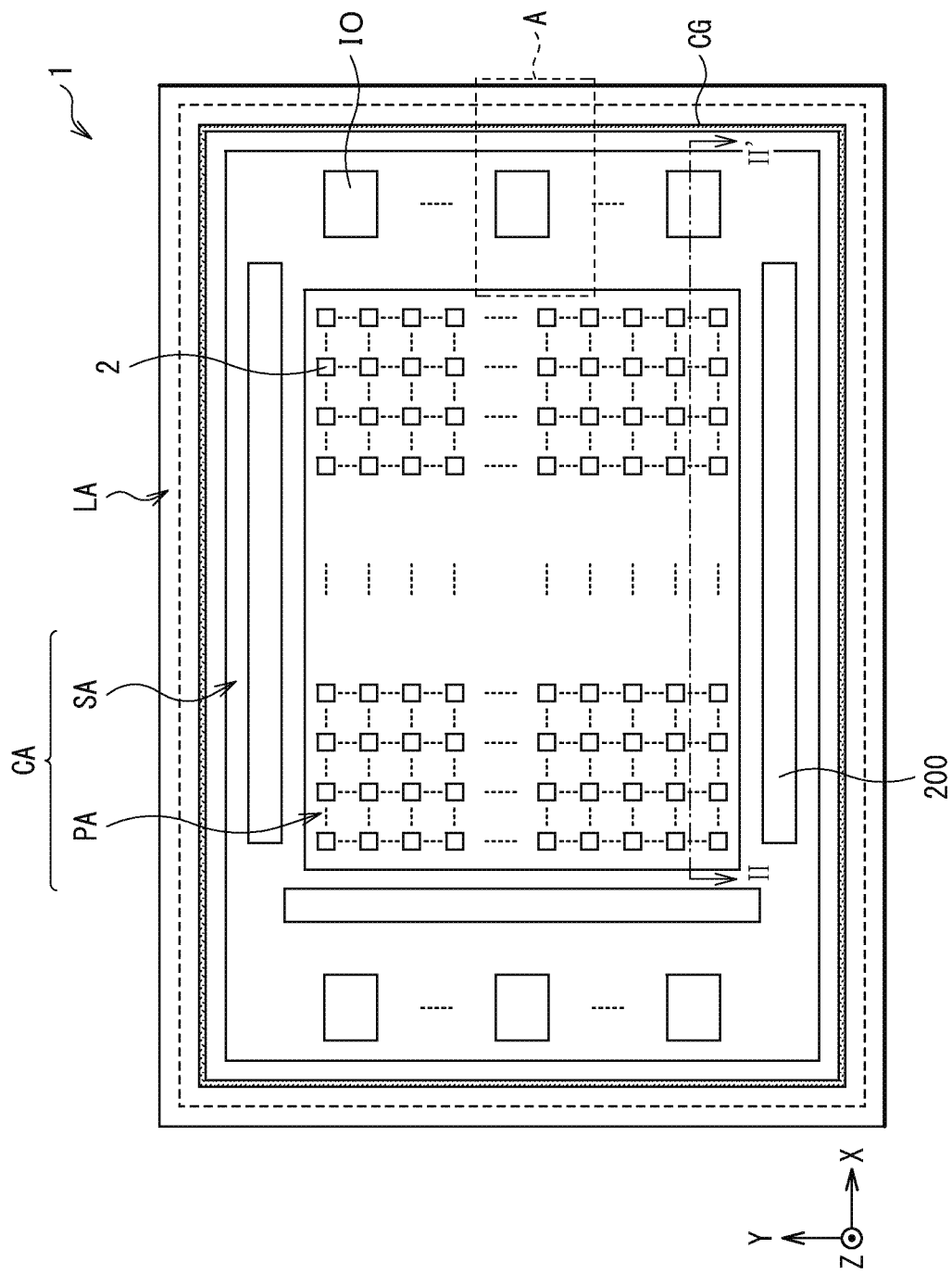
[FIG. 1]

[FIG. 2]
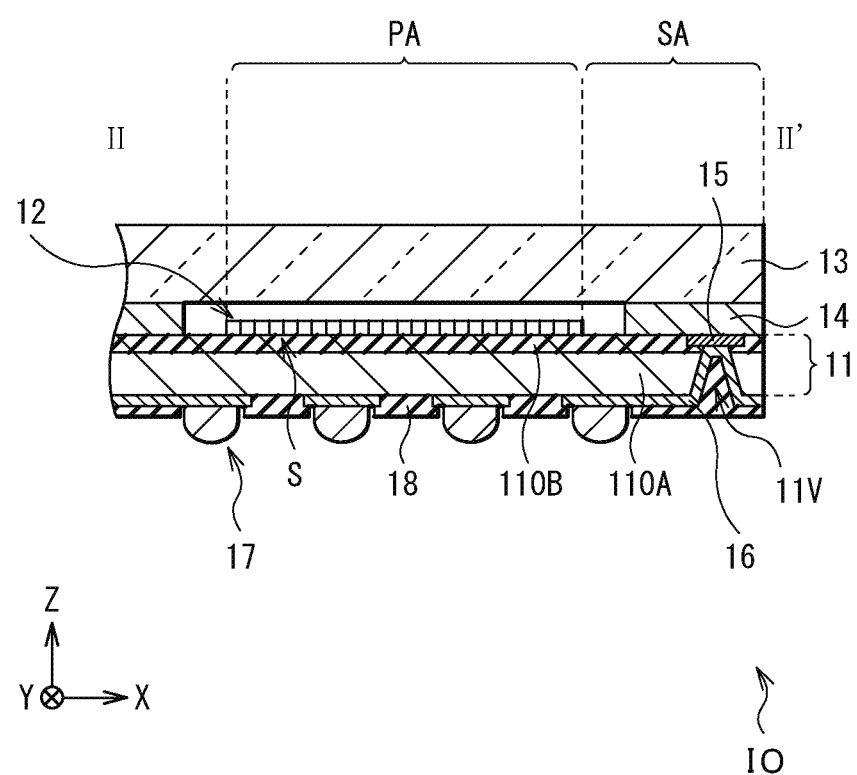

[FIG. 3]
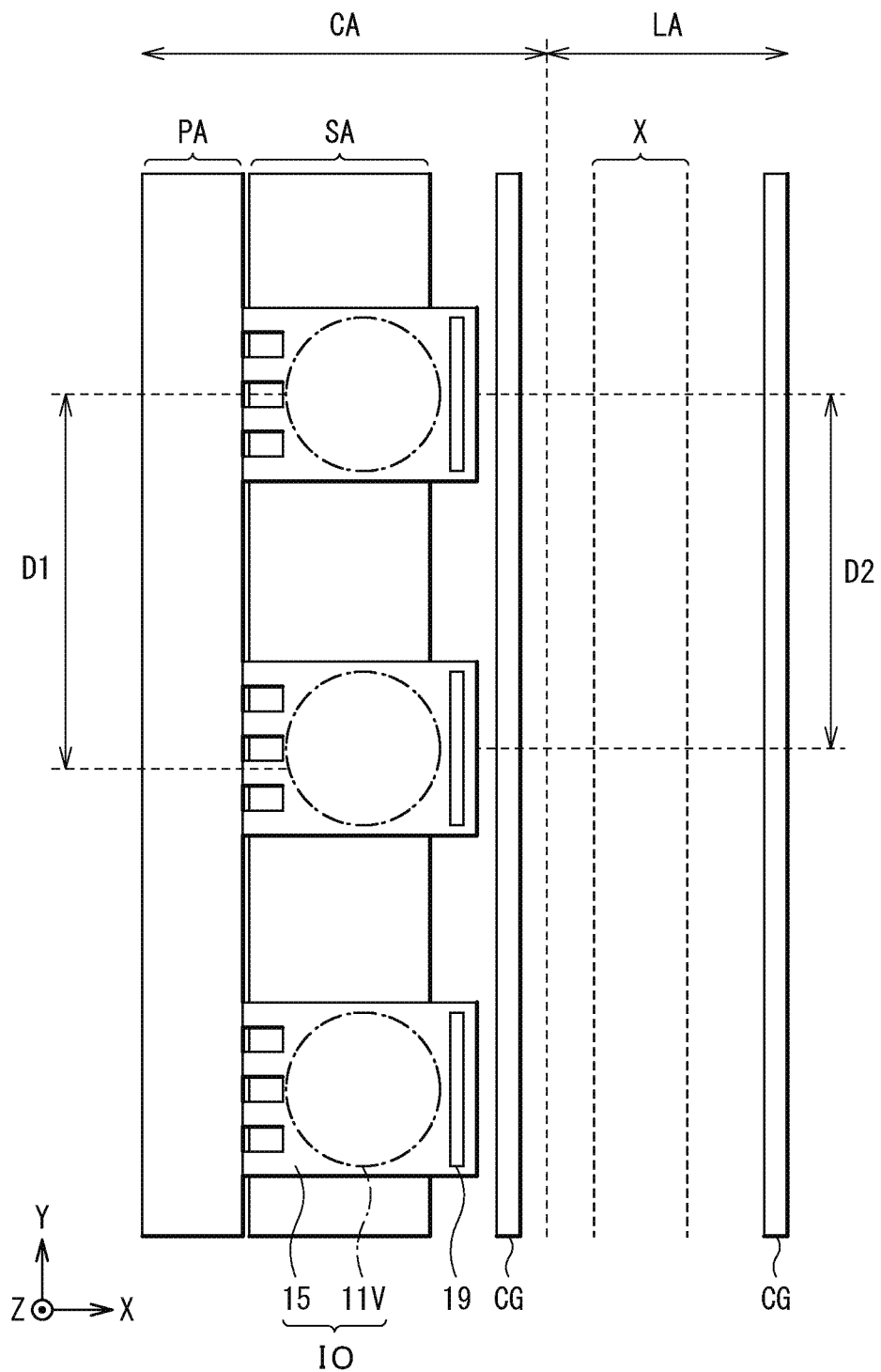

[FIG. 4]
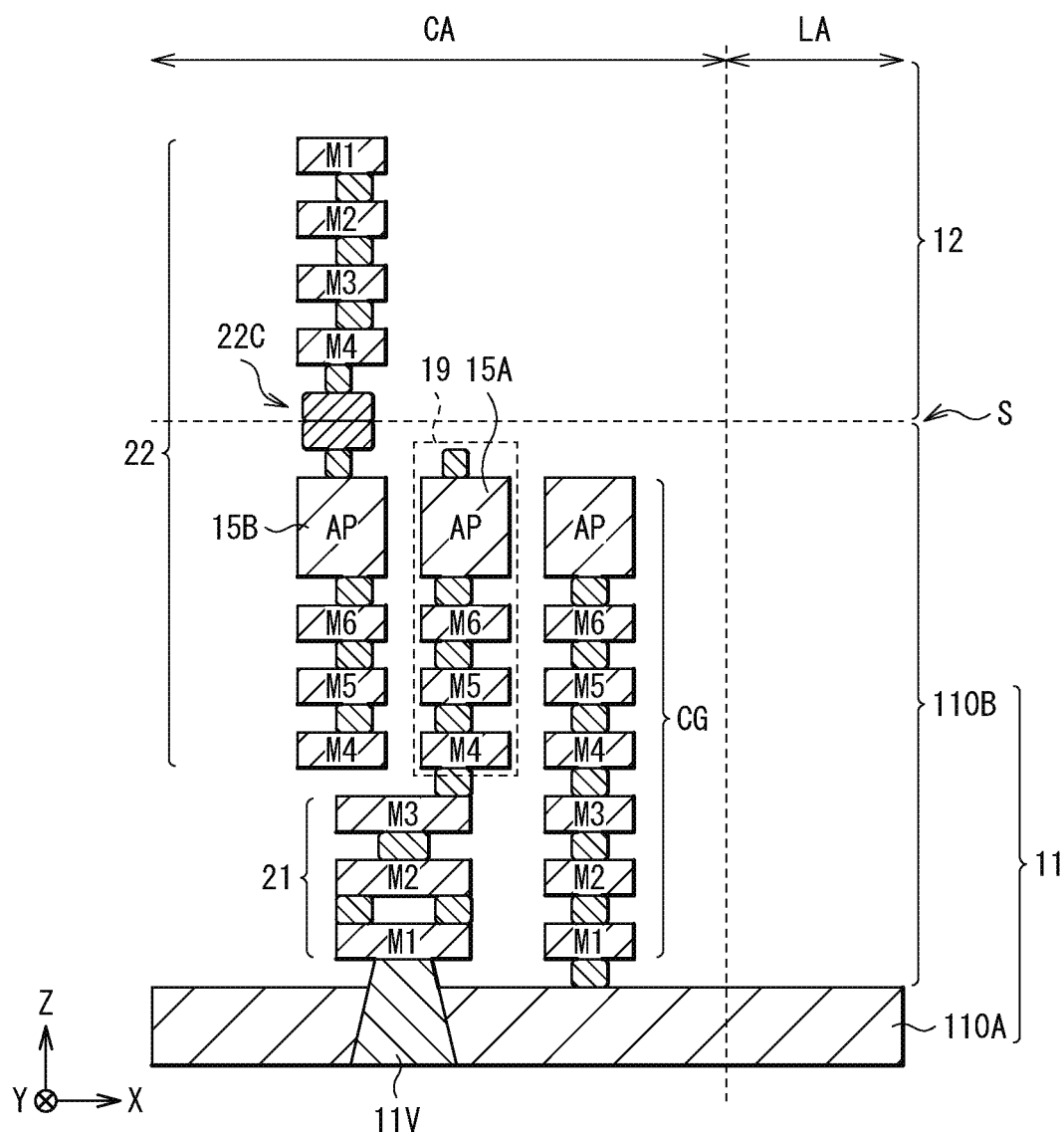

[FIG. 5]
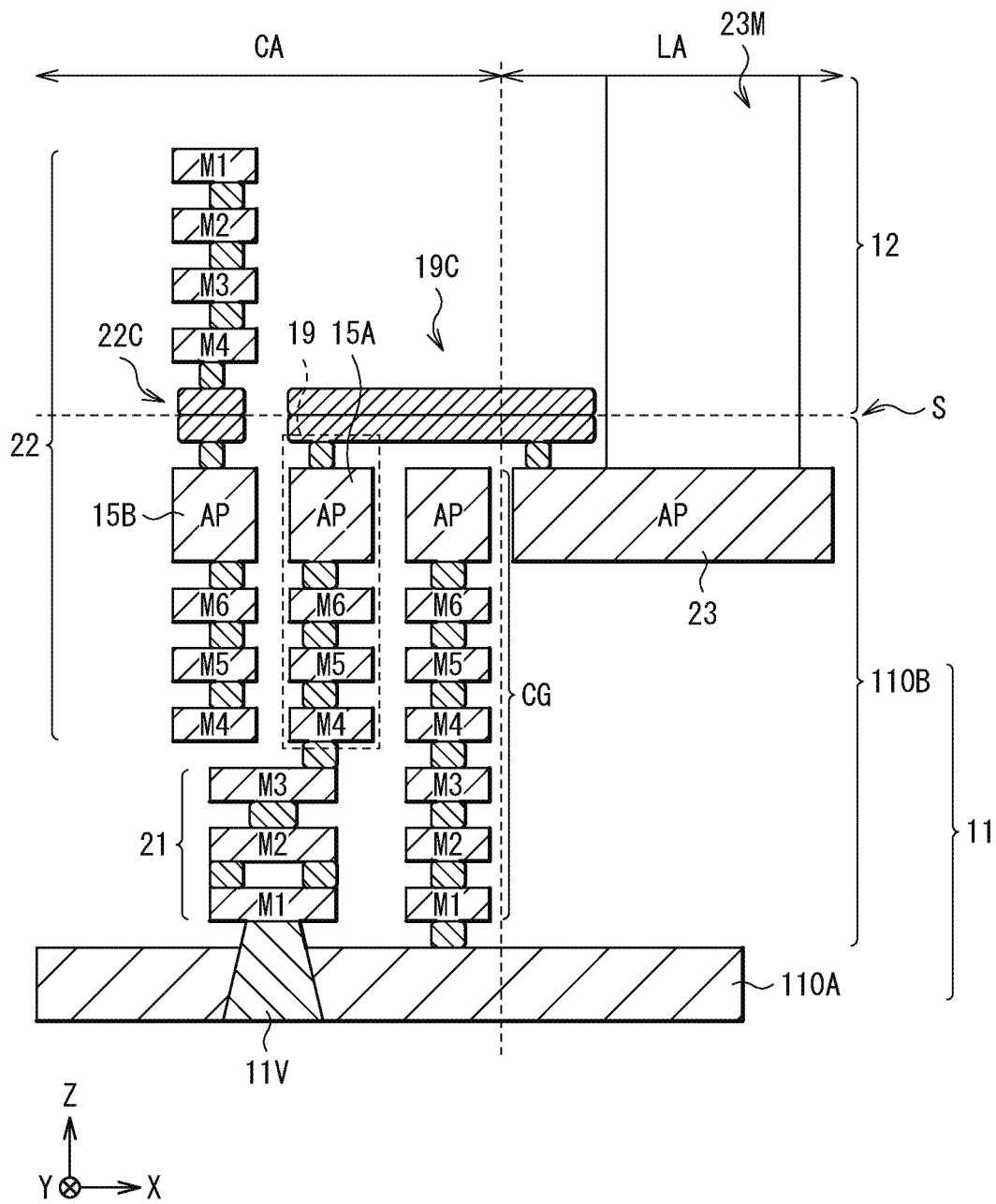

[FIG. 6]
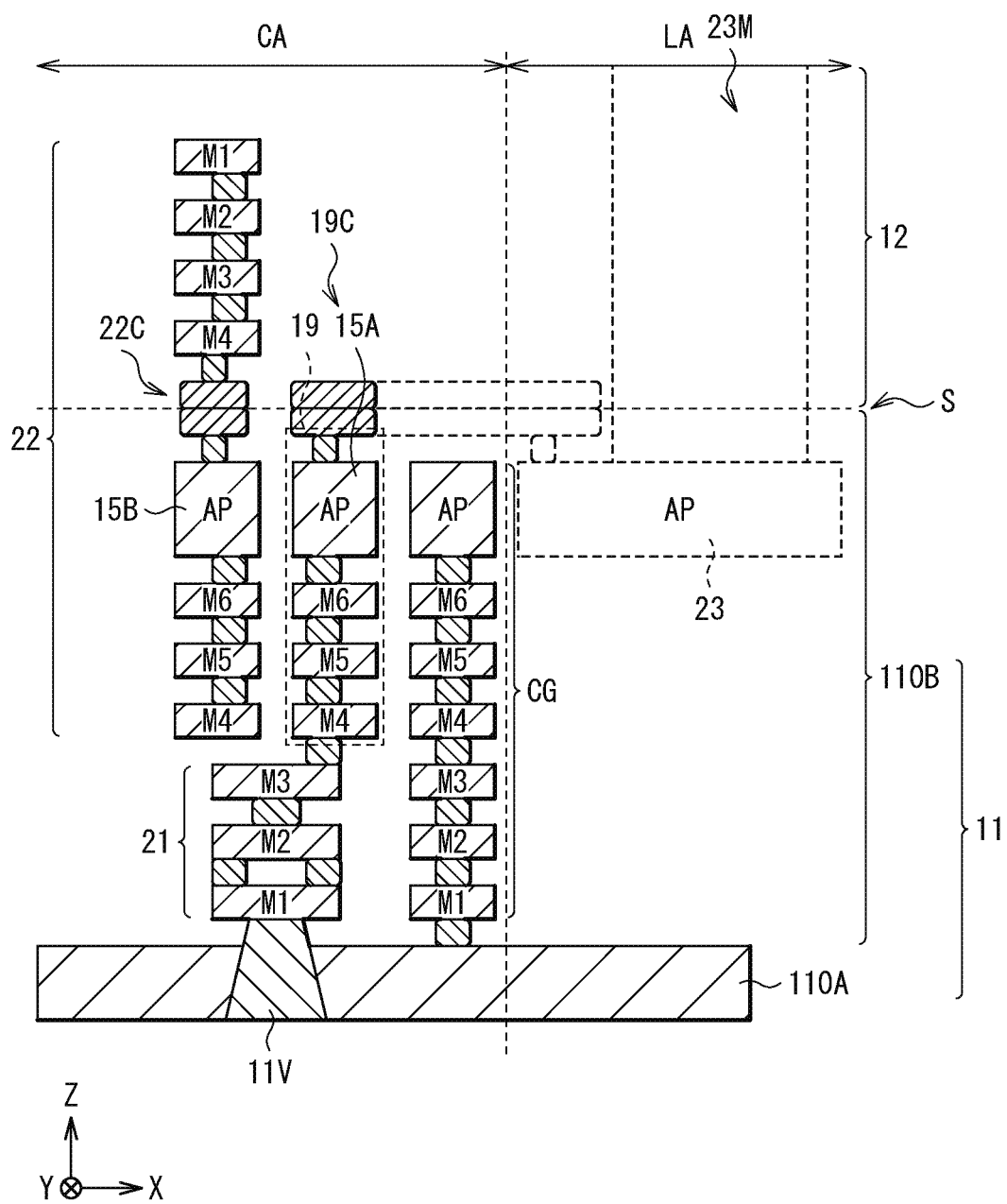

[FIG. 7]
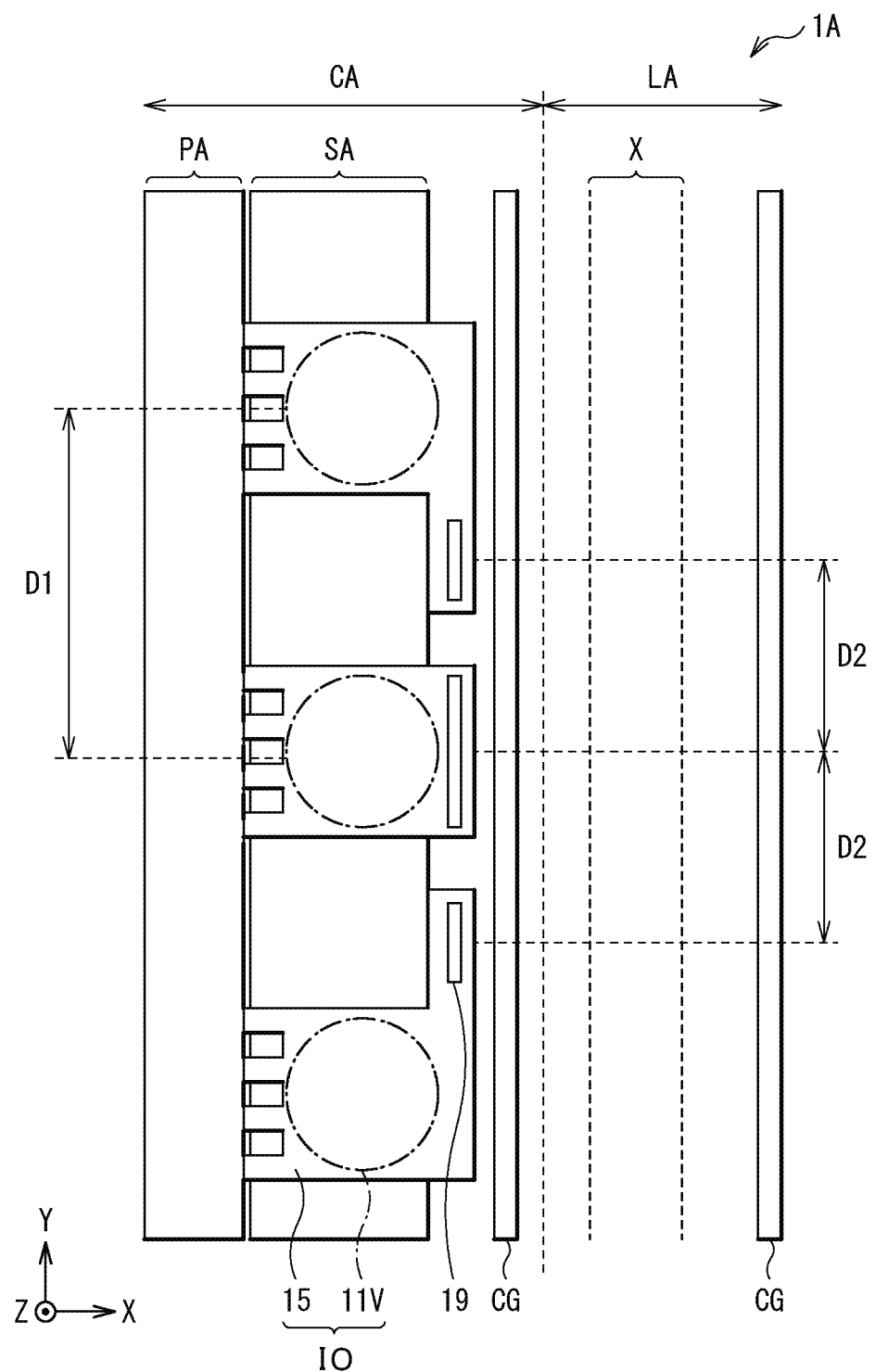

[FIG. 8]
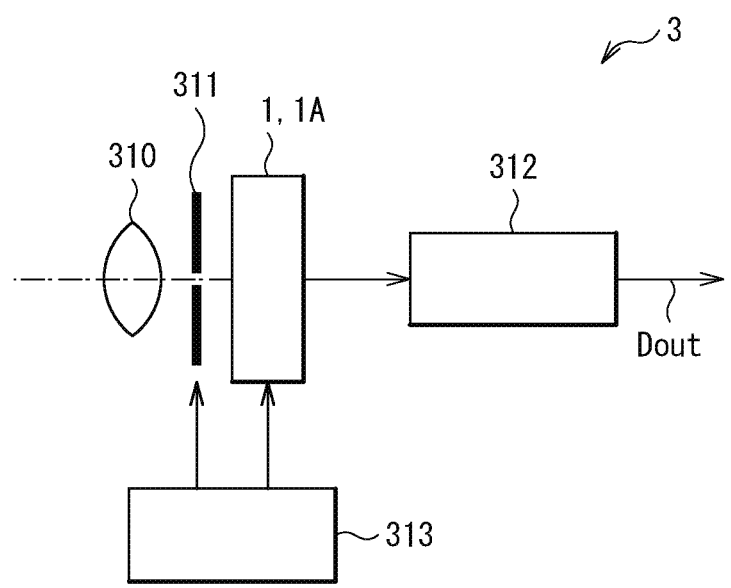

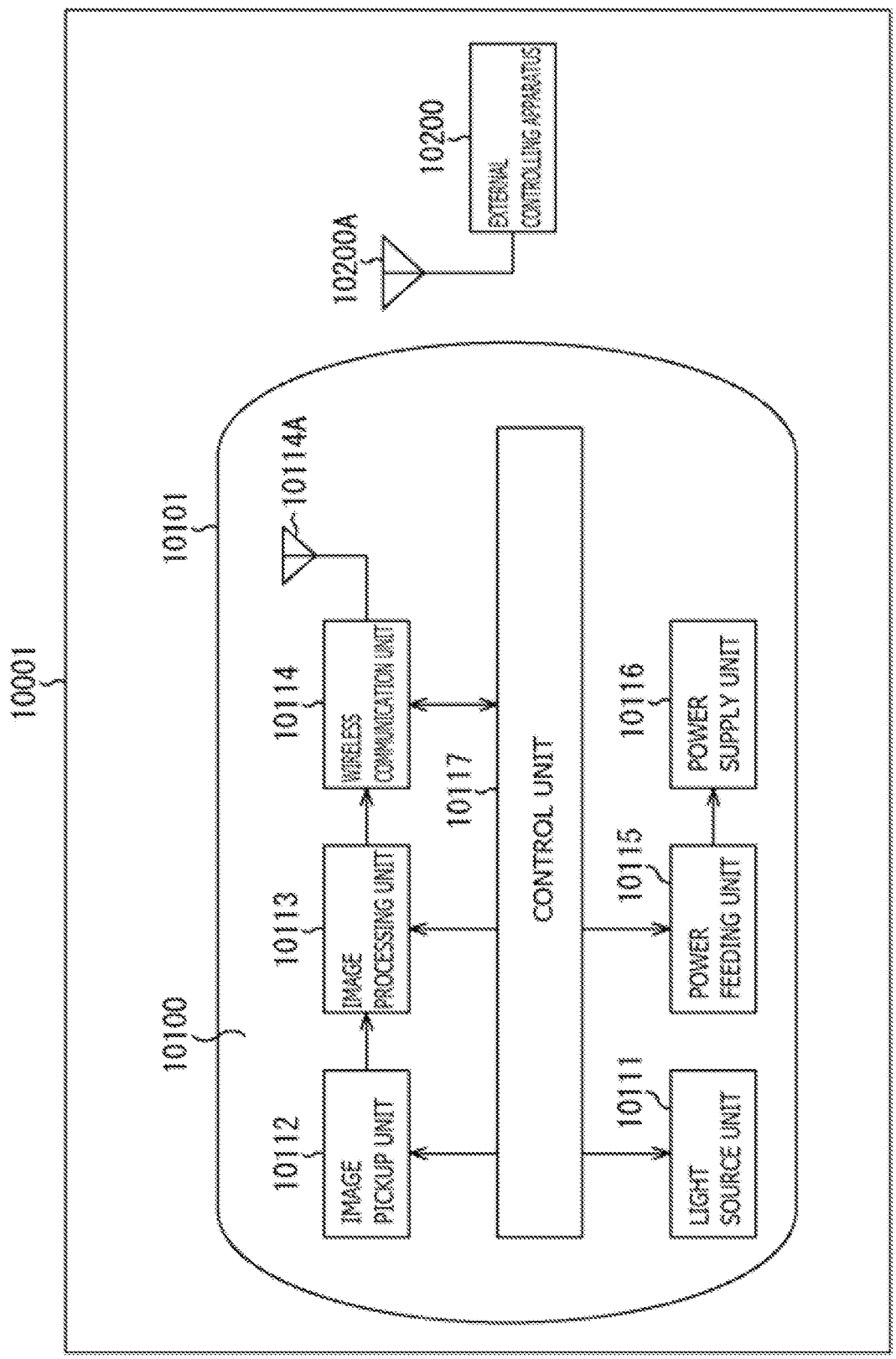

[FIG. 10]
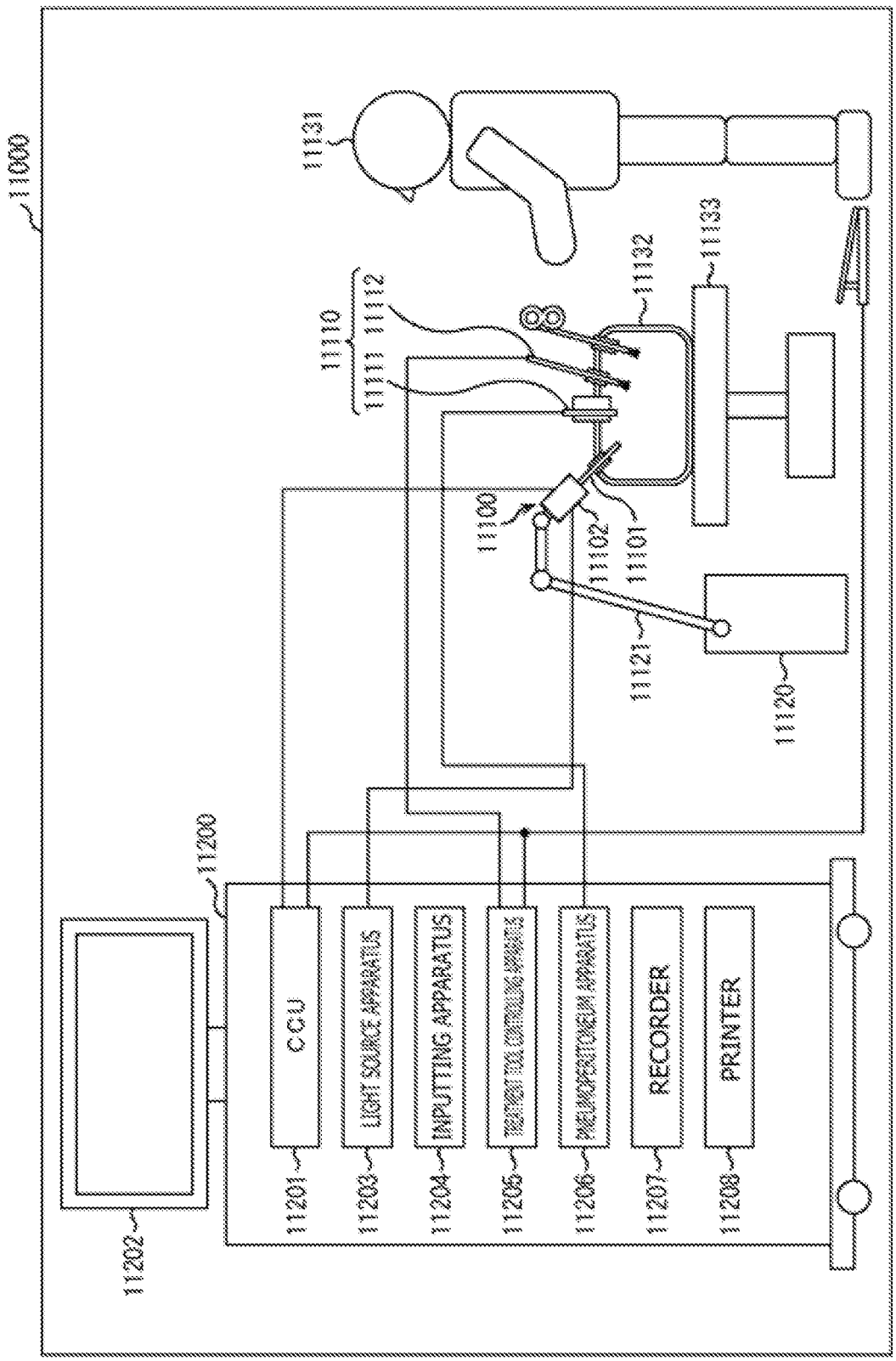

[FIG. 11]
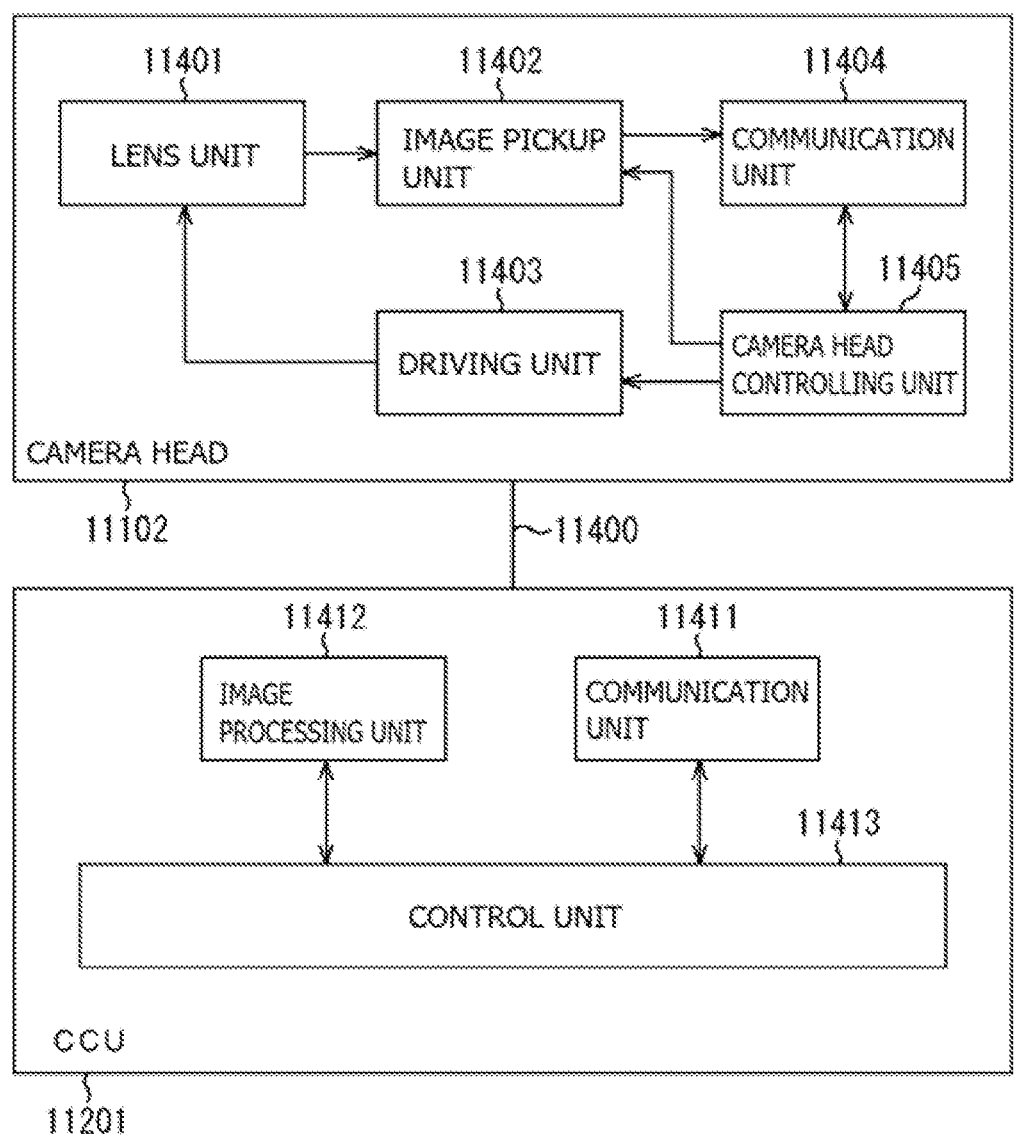

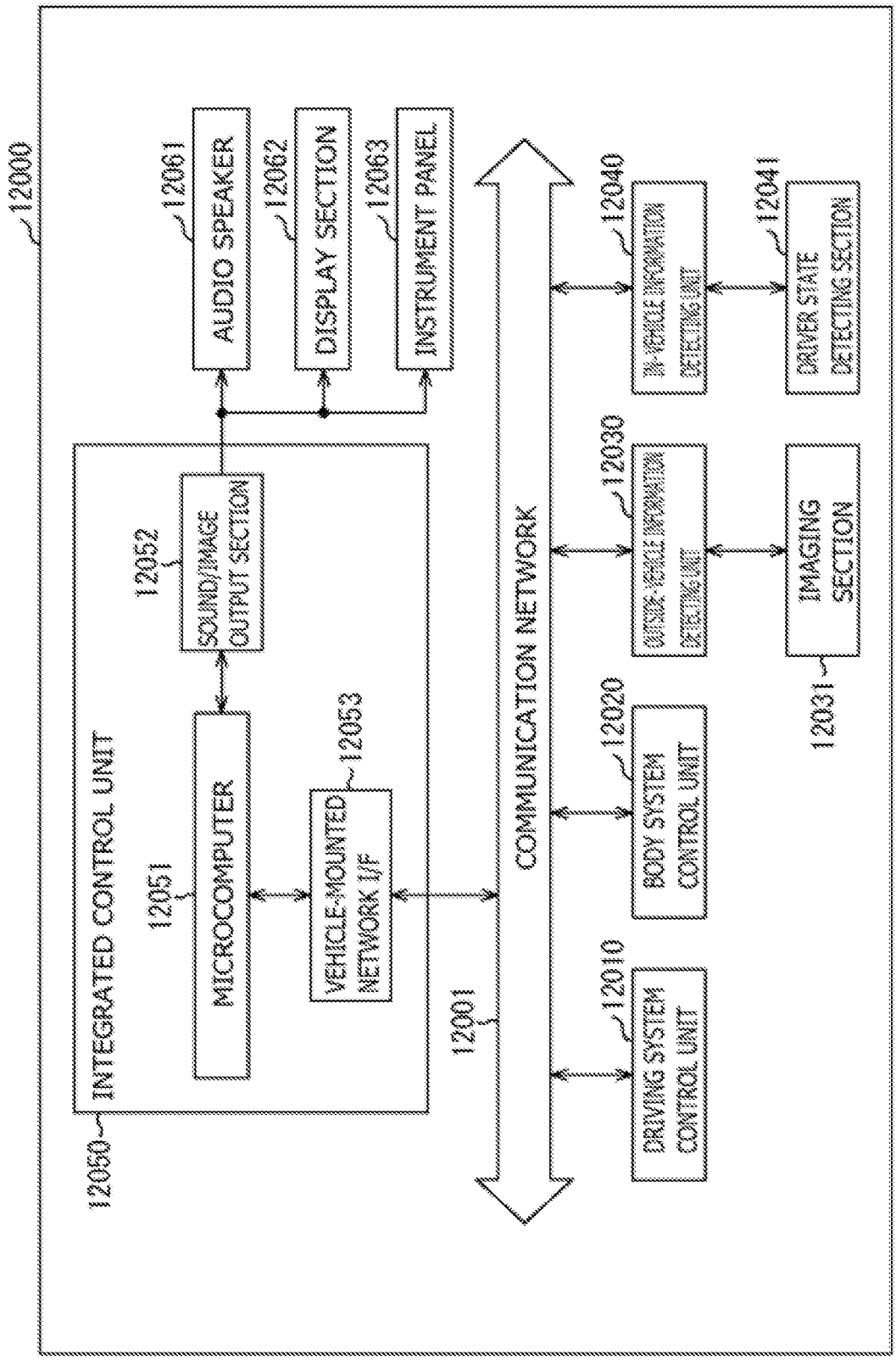

[FIG. 13]
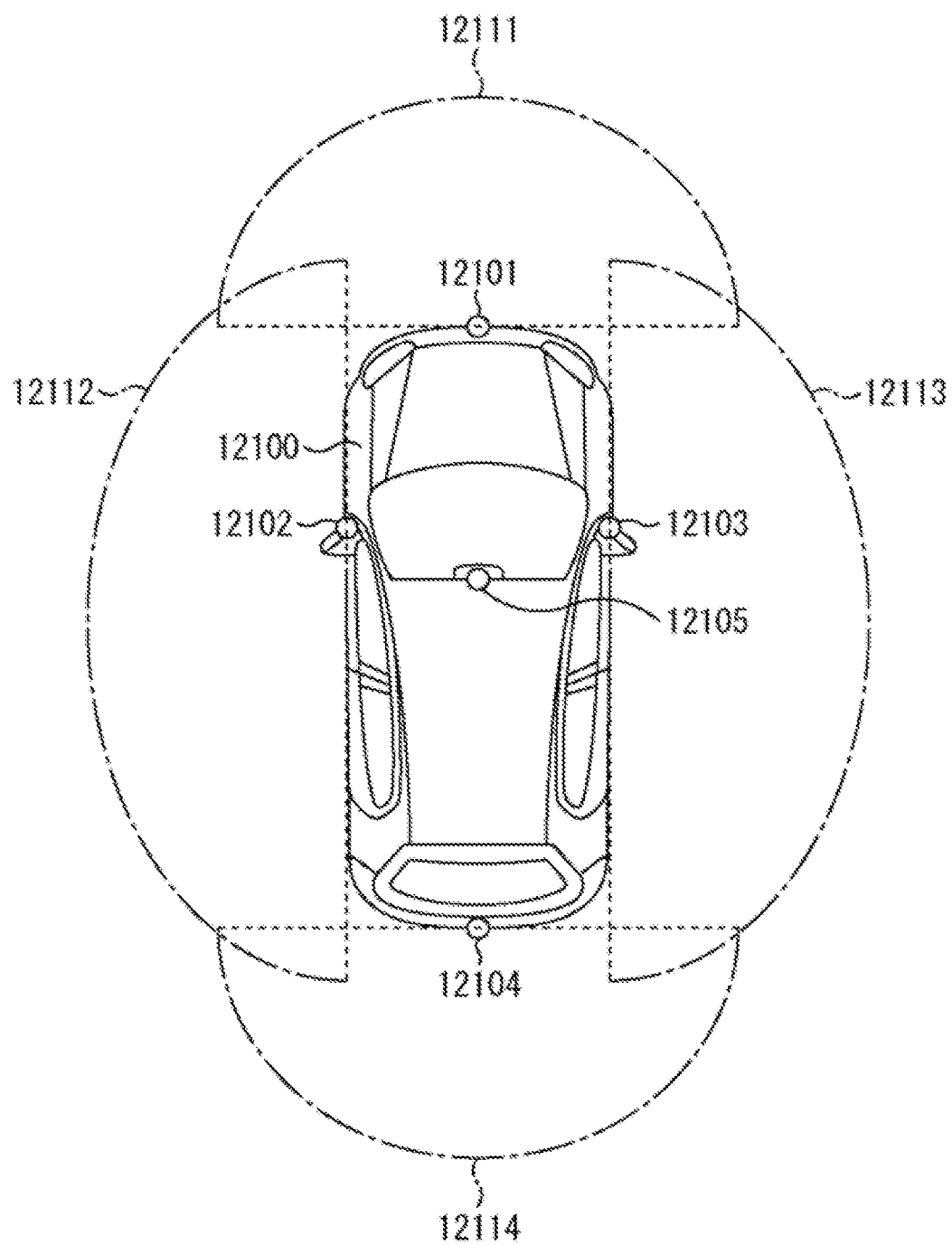

[FIG. 14]
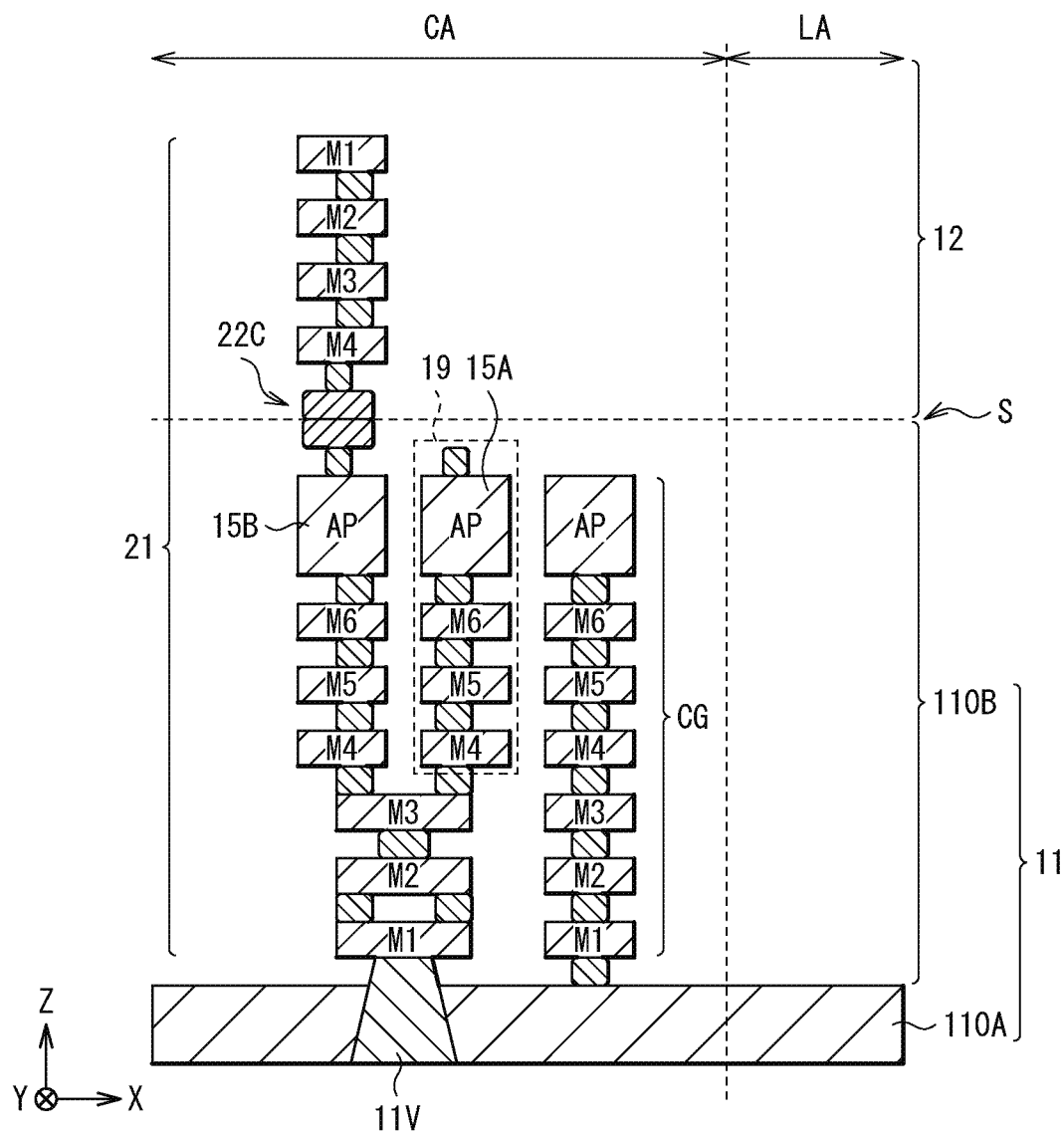

IMAGING DEVICE

CROSS REFERENCE TO RELATED APPLICATIONS

This application is a U.S. National Phase of International Patent Application No. PCT/JP2019/004673 filed on Feb. 8, 2019, which claims priority benefit of Japanese Patent Application No. JP 2018-041954 filed in the Japan Patent Office on Mar. 8, 2018. Each of the above-referenced applications is hereby incorporated herein by reference in its entirety.

TECHNICAL FIELD

The present disclosure relates to an imaging device that is suitable for, for example, WLCSP (Wafer Level Chip Size Package) or the like.

BACKGROUND ART

Imaging devices such as WLCSP have recently been developed. Such an imaging device includes a light receiving element between a circuit board and a protective member, for example (for example, see PTL 1). That is, light incident side of the light receiving element is covered with the protective member. One surface (front surface) of the circuit board has the light receiving element mounted thereon, and the other surface (back surface) of the circuit board is provided with a terminal for external coupling.

CITATION LIST

Patent Literature

PTL 1: Japanese Unexamined Patent Application Publication No. 2009-15862

SUMMARY OF THE INVENTION

In such a packaged imaging device, it is desired to reduce time required to evaluate a prototype.

Therefore, it is desirable to provide an imaging device that is able to reduce time required to evaluate a prototype.

An imaging device according to an embodiment of the present disclosure includes: a pixel area and a peripheral area that lies outside the pixel area; a light receiving element provided in the pixel area; a circuit board provided in the pixel area and the peripheral area, the circuit board including a semiconductor substrate and a multilayer wiring layer, the multilayer wiring layer being provided between the semiconductor substrate and the light receiving element; a first wiring line provided in the multilayer wiring layer, the first wiring line being electrically coupled to the light receiving element; a protective member that is opposed to the circuit board, the protective member and the circuit board sandwiching the light receiving element; and an extended wiring section provided between the semiconductor substrate and the protective member in the peripheral area. One end of the extended wiring section is open, and another end of the extended wiring section is electrically coupled to the first wiring line.

The imaging device according to an embodiment of the disclosure is provided with the extended wiring section in the peripheral area. To the one end of the extended wiring section, a pad electrode is coupled from light incident side, for example, and thus, a prototype is evaluated. That is, it is possible to evaluate the prototype prior to a CSP process. After trial manufacture, mass production is performed with one ends of the respective extended wiring sections open.

The imaging device according to an embodiment of the disclosure is provided with the extended wiring section in the peripheral region; thus, it becomes possible to evaluate the prototype prior to the CSP process. Accordingly, it is possible to evaluate the prototype at an earlier stage than a case where the prototype is evaluated after going through the CSP process. Therefore, it is possible to reduce time required for evaluation of the prototype.

It is to be noted that the above is an example of the present disclosure. The effects of the present disclosure are not limited to those described above, and may include other different effects or may further include other effects.

BRIEF DESCRIPTION OF DRAWINGS

FIG. 1 is a plan schematic view of a schematic configuration of an imaging device according to an embodiment of the disclosure.

FIG. 2 is a schematic view of a cross-sectional configuration taken along a line II-II' illustrated in FIG. 1.

FIG. 3 is an enlarged plan schematic view of an area A illustrated in FIG. 1.

FIG. 4 is a cross-sectional schematic view of an example of a configuration around the extended wiring section illustrated in FIG. 3

FIG. 5 is a cross-sectional schematic view of a state in which evaluation of a prototype is performed via the extended wiring section illustrated in FIG. 4.

FIG. 6 is a cross-sectional schematic view of another example (1) of the extended wiring section illustrated in FIG. 4.

FIG. 7 is a plan schematic view of a configuration of main components of an imaging device according to a modification example.

FIG. 8 is a functional block diagram illustrating an example of an electronic apparatus including the imaging device illustrated in FIG. 1, etc.

FIG. 9 is a block diagram depicting an example of a schematic configuration of an in-vivo information acquisition system.

FIG. 10 is a view depicting an example of a schematic configuration of an endoscopic surgery system.

FIG. 11 is a block diagram depicting an example of a functional configuration of a camera head and a camera control unit (CCU).

FIG. 12 is a block diagram depicting an example of schematic configuration of a vehicle control system.

FIG. 13 is a diagram of assistance in explaining an example of installation positions of an outside-vehicle information detecting section and an imaging section.

FIG. 14 is a cross-sectional schematic view of another example (2) of the extended wiring section illustrated in FIG. 4.

MODES FOR CARRYING OUT THE INVENTION

In the following, some embodiments of the present disclosure are described in detail with reference to the drawings. It is to be noted that description is given in the following order.

1. Embodiment (An imaging device including an extended wiring section)

2. Modification Example (An example in which a distance between extended wiring sections adjacent to each other is shorter than a distance between through electrodes adjacent to each other)
3. Application Example (An electronic apparatus)
4. Practical Application Example 1. Embodiment

[Configuration of Imaging Device 1]

FIG. 1 schematically illustrates an example of a planar configuration of an imaging device (an imaging device 1) according to an embodiment of the disclosure. The imaging device 1 is provided, for example, by dividing a plurality of chips (imaging devices 1) arranged on a large-sized semiconductor wafer, and has, for example, a quadrangular chip area CA and a scribe area LA that lies outside the chip area CA. The chip area CA is provided with, for example, a quadrangular pixel area PA and a peripheral area SA that lies outside the pixel area PA. The peripheral area SA is provided so as to surround the pixel area PA, and includes a peripheral circuit 200 that drives the pixel area PA, a plurality of input-output sections IO, and a chip-peripheral guard ring CG. The scribe area LA is provided so as to surround the chip area CA.

The pixel area PA of the imaging device 1 is provided with, for example, a plurality of light-receiving unit areas (pixels 2) disposed two-dimensionally. The peripheral area SA is provided between the pixel area PA and the scribe area LA, and the peripheral circuit 200 of the peripheral area SA includes, for example, a row scanner, a horizontal selector, a column scanner, and a system controller.

The row scanner is a pixel driver that includes a shift register, an address decoder, etc., and drives each pixel 2 of the pixel area PA, for example, on a row-by-row basis. A signal outputted from each pixel 2 of a pixel row selected and scanned by the row scanner is supplied to the horizontal selector through each vertical signal line. The horizontal selector includes an amplifier, a horizontal selection switch, etc. that are provided for each vertical signal line.

The column scanner includes a shift register, an address decoder, etc., and sequentially drives the horizontal selection switches of the horizontal selector while scanning. Through this selective scanning by the column scanner, signals of the respective pixels each transmitted through a corresponding vertical signal line are sequentially outputted to a horizontal signal line, and are inputted to an unillustrated signal processor or the like through the horizontal signal line.

The system controller receives a clock given from the outside or data instructing an operation mode, etc., and outputs data such as internal information of the imaging device 1. Furthermore, the system controller includes a timing generator that generates various timing signals, and performs drive control of the row scanner, the horizontal selector, and the column scanner on the basis of the various timing signals generated by the timing generator.

The input-output section IO provided in the peripheral area SA is a portion that inputs and outputs a signal between the imaging device 1 and the outside. Through the input-output section IO, an electric signal is inputted to each pixel 2 or the peripheral circuit 200 from the outside. Alternatively, the electric signal outputted from each pixel 2 or the peripheral circuit 200 is extracted to the outside through the input-output section IO. FIG. 1 illustrates an example in which a plurality of input-output sections IO are arranged on two opposite sides on the outer side of the quadrangular pixel area PA; however, the input-output sections IO may be provided on two adjacent sides, or the input-output sections IO may be provided on one side or three sides or more. A detailed configuration of an area A including the input-output section IO will be described later.

The chip-peripheral guard ring CG provided outside the peripheral circuit 200 is disposed, for example, along an edge of the chip area CA. The chip-peripheral guard ring CG includes, for example, a conductive layer provided in the same layer as a wiring line provided in the peripheral area SA (see FIG. 4 and the like to be described later). Provision of such a chip-peripheral guard ring CG makes it possible to suppress generation of chipping when dicing the scribe area LA with a blade. The scribe area LA is an area between the imaging devices 1 adjacent to each other. The scribe area LA is an area that is diced by a blade when a plurality of imaging devices 1 is divided into individuals.

FIG. 2 illustrates a cross-sectional configuration of the imaging device 1 taken along a line II-II' illustrated in FIG. 1. A more specific configuration of the chip area CA of the imaging device 1 will be described with reference to FIG. 2.

The imaging device 1 includes a circuit board 11, a light receiving element 12, and a glass substrate 13 (a protective member) in this order, and the light receiving element 12 is sealed between the circuit board 11 and the glass substrate 13. That is, the imaging device 1 is WCSP. The circuit board 11 and the glass substrate 13 are bonded together via an adhesion layer 14 at respective peripheral sections (peripheral areas SA) of the circuit board 11 and the glass substrate 13, and an area surrounded by the circuit board 11, the glass substrate 13, and the adhesion layer 14 is a cavity for hermetically sealing the light receiving element 12. In this area, for example, a resin material or the like having a refractive index substantially the same as a refractive index of the glass substrate 13 may be provided. Circuit board 11 side of the imaging device 1 is mounted on a printed board such as a motherboard, and glass substrate 13 side of the imaging device 1 is bonded to, for example, a lensing unit.

The circuit board 11 provided in the chip area CA (the pixel area PA and the peripheral area SA) includes, for example, a semiconductor substrate 110A and a multilayer wiring layer 110B, and has a stacked structure of the semiconductor substrate 110A and the multilayer wiring layer 110B. The semiconductor substrate 110A is opposed to the glass substrate 13 with the multilayer wiring layer 110B disposed therebetween. The semiconductor substrate 110A includes, for example, a silicon (Si) substrate.

The multilayer wiring layer 110B is provided between the semiconductor substrate 110A and the glass substrate 13. A bonding surface S is provided between the multilayer wiring layer 110B and a multilayer wiring layer of the light receiving element 12. The multilayer wiring layer 110B has a pad electrode 15 in the input-output section IO in the peripheral area SA.

FIG. 3 is a specific plan view of a configuration of the periphery of the input-output section IO. FIG. 3 is an enlarged view of an area A illustrated in FIG. 2.

The configuration around the input-output section IO will be described with reference to FIG. 2 and FIG. 3. It is to be noted that FIG. 3 illustrates the chip-peripheral guard rings CG provided to the respective imaging devices 1 that are adjacent to each other and a separation area X (area to be diced) between two chip-peripheral guard rings CG. The pad electrode 15 provided in the input-output section IO has, for example, a substantially quadrangular planar shape. The pad electrode 15 includes a metal such as copper (Cu) or aluminum (Al).

The semiconductor substrate 110A and the multilayer wiring layer 110B (the circuit board 11) have a through via 11V at a position corresponding to the pad electrode 15, i.e. the input-output section IO. The through via 11V penetrates from a front surface to a back surface of the semiconductor substrate 110A, thereby exposing a portion of the pad electrode 15. The through via 11V has, for example, a circular planar shape.

A conductive film 16 is formed on a sidewall and a base of the through via 11V (FIG. 2). The conductive film 16 covers a front surface of the pad electrode 15 exposed at the base of the through via 11V and is drawn out from the through via 11V to the back surface (the surface that opposes the surface on which the multilayer wiring layer 110B is provided) of the semiconductor substrate 110A. The conductive film 16 and the through via 11V correspond to a specific example of a through electrode of the present technology. The input-output section IO includes, for example, such a pad electrode 15, conductive film 16, and through via 11V.

In this embodiment, an extended wiring section 19 is provided at or near the input-output section IO (FIG. 3). The extended wiring section 19 is provided at or near an edge of the circuit board 11 and is disposed between the through via 11V and the chip-peripheral guard ring CG, for example, in a planar view (the XY plane in FIG. 3). As will be described in detail later, the extended wiring section 19 is configured to be couplable to a test pad electrode (a test pad electrode 23 of FIG. 5 to be described later). Via the extended wiring section 19 and the test pad electrode 23, a wiring line (a wiring line 21 to be described later) of the multilayer wiring layer 110B is drawn out to light incident surface side of the semiconductor substrate 110A. That is, it is possible to evaluate a prototype from light incident side by using the extended wiring section 19 prior to the CSP process. For example, the extended wiring section 19 is provided at or near each of the plurality of input-output sections IO. A distance D2 between extended wiring sections 19 adjacent to each other is substantially the same as a distance D1 between through vias 11V adjacent to each other. In other words, a pitch of the extended wiring sections 19 and a pitch of the input-output sections IO are substantially the same.

FIG. 4 schematically illustrates a cross-sectional configuration around the extended wiring section 19. The extended wiring section 19 includes, for example, conductive layers M4, M5, M6, and a conductive layer 15A, which are included in the multilayer wiring layer 110B, in this order from semiconductor substrate 110A side. The conductive layer 15A includes a pad electrode. One end of the extended wiring section 19 is the conductive layer 15A, and the other end of the extended wiring section 19 is the conductive layer M4. That is, the extended wiring section 19 is provided in the multilayer wiring layer 110B between the semiconductor substrate 110A and the glass substrate 13 (FIG. 2). The extended wiring section 19 may be provided between the semiconductor substrate 110A and the glass substrate 13, and, for example, a portion or all of the extended wiring section 19 may be provided in the multilayer wiring layer of the light receiving element 12. The one end of the extended wiring section 19 is open and the other end of the extended wiring section 19 is coupled to the wiring line 21 (a first wiring line) of the multilayer wiring layer 110B. At least the one end of the extended wiring section 19 is preferably provided at or near the edge of the circuit board 11 and is disposed at a position closer to the pixel area PA than to the chip-peripheral guard ring CG.

The wiring line 21 is, for example, a portion of a wiring line included in the peripheral circuit 200 (FIG. 1) and is electrically coupled to the light receiving element 12. The wiring line 21 includes, for example, conductive layers M1, M2, and M3, which are included in the multilayer wiring layer 110B, in this order from the semiconductor substrate 110A side. One end of the wiring line 21 is the conductive layer M3 and the other end of the wiring line 21 is the conductive layer M1. For example, the one end of the wiring line 21 is electrically coupled to the other end (the conductive layer M4) of the extended wiring section 19 and the light receiving element 12, and the other end of the wiring line 21 is coupled to the conductive film 16 provided on the through via 11V. That is, the other end of the extended wiring section 19 is coupled to the through electrode via the wiring line 21. To the wiring line 21, a signal may be inputted from back surface side of the semiconductor substrate 110A after the CSP process, and a signal may be inputted from front surface side of the semiconductor substrate 110A via the extended wiring section 19 prior to the CSP process.

The conductive layers M4, M5, M6, and 15A included in the extended wiring section 19 are each provided in the same layer as a wiring line 22 (a second wiring line) included in the multilayer wiring layer 110B, for example. The wiring line 22 is, for example, a portion or all of wiring lines included in the peripheral circuit 200 (FIG. 1) and is electrically coupled to the light receiving element 12. The wiring line 22 includes: conductive layers M4, M5, M6, and 15B of the multilayer wiring layer 110B; and conductive layers M1, M2, M3, and M4 included in the multilayer wiring layer of the light receiving element 12. The wiring line 22 has a bonding section 22C on the bonding surface S. The bonding section 22C includes, for example, a Cu—Cu bonding. The conductive layers 15A and 15B are provided in the same layer as the pad electrode 15, for example.

FIG. 5 illustrates a state of the extended wiring section 19 when evaluating a prototype. When evaluating the prototype, the test pad electrode 23 is coupled to the one end of the extended wiring section 19 (the conductive layer 15A) via a bonding section 19C. The bonding section 19C is a bonding section of the multilayer wiring layer of the light receiving element 12 provided on the bonding surface S and the multilayer wiring layer 110B of the circuit board 11, and includes, for example, a Cu—Cu bonding. An opening for exposing the test pad electrode 23 is provided at the multilayer wiring layer of the light receiving element 12 and the multilayer wiring layer 110B, and a signal is inputted and outputted between the outside and the prototype via the test pad electrode 23 and the extended wiring section 19. In this way, the wiring line 21 of the multilayer wiring layer 110B is taken out from the light incident surface side of the semiconductor substrate 110 prior to the CSP process and the prototype is evaluated. The test pad electrode 23 and the opening may be provided only for a prototype that requires evaluation.

FIG. 6 illustrates another example of the configuration of the extended wiring section 19. The extended wiring section 19 may include a portion of the bonding section 19C provided on the bonding surface S.

The light receiving element 12 provided in the pixel area PA is a solid-state imaging element such as a CCD (Charge Coupled Device) or a CMOS (Complementary Metal Oxide Semiconductor), and a light receiving surface (light incident surface) is provided with an unillustrated color filter. The light receiving element 12 performs exposure and reading of a light receiving signal in accordance with an electric signal inputted through the input-output section IO, and the read light receiving signal is outputted to the outside through the input-output section IO.

The glass substrate 13 that covers the light receiving surface of the light receiving element 12 has a thickness which is sufficiently larger than the thickness of the circuit board 11. For example, an IR (infrared ray) cut filter or the like may be provided on a front surface of the glass substrate 13 (a surface opposed to a surface on light receiving element 12 side). The glass substrate 13 is opposed to the circuit board 11 with the light receiving element 12 interposed therebetween.

A solder ball 17 and a sealing resin layer 18 are disposed on the back surface of the semiconductor substrate 110A together with the conductive film 16. The conductive film 16 is provided on a selective area of the back surface of the semiconductor substrate 110A, and the solder ball 17 is coupled to the conductive film 16. The sealing resin layer 18 covers the conductive film 16 and has an opening that exposes the conductive film 16. The solder ball 17 is provided on the opening of the sealing resin layer 18.

The conductive film 16 extends from an inside of the through via 11V to the back surface of the semiconductor substrate 110A and is drawn out to an area in which the solder ball 17 is formed. The conductive film 16 is for electrically coupling the solder ball 17 to the pad electrode 15, and functions as a rewiring line.

The solder ball 17 functions as an external coupling terminal to be mounted on a printed board, and includes, for example, a lead-free high melting point solder or the like such as Sn—Ag—Cu. For example, a plurality of solder balls 17 is regularly arranged at a predetermined pitch on the back surface of the semiconductor substrate 110A. The arrangement of the solder balls 17 is appropriately set in accordance with positions of bonding pads on an unillustrated printed board to be mounted. Consequently, an arrangement of the pad electrodes 15 is converted into the arrangement of the solder balls 17, which makes it possible to perform direct mounting on a printed board such as a motherboard. The solder ball 17 is electrically coupled to the pad electrode 15 via the conductive film 16.

The sealing resin layer 18 is for protecting the conductive film 16 and has an opening corresponding to the solder ball 17. This sealing resin layer 18 includes, for example, an epoxy-based resin, a polyimide-based resin, a silicon-based resin, an acrylic-based resin, or the like.

In the imaging device 1, the pad electrode 15 provided in the input-output section IO is drawn out to a back surface of the circuit board 11 by the through electrode (the through via 11V and the conductive film 16); therefore, a signal is inputted and outputted between the outside and the light receiving element 12 from back surface side of the circuit board 11. Such an imaging device 1 eliminates the need for an opening to be coupled to the pad electrode on light incident surface side of the circuit board 11, thereby being able to reduce a chip size.

When evaluating a prototype, the test pad electrode 23 is coupled to the one end of the extended wiring section 19 (FIG. 5). Via the test pad electrode 23 and the extended wiring section 19, a signal is inputted and outputted between the outside and the light receiving element 12 from the light incident surface side of the semiconductor substrate 110A. In this way, in the imaging device 1, it is possible to evaluate the prototype prior to the CSP process.

[Workings and Effects of Imaging Device 1]

The imaging device 1 of the present embodiment is provided with the extended wiring section 19 in the multi-layer wiring layer 110B in the peripheral area SA, which makes it possible, prior to the CSP process, to couple the test pad electrode 23 to the extended wiring section 19 from the light incident surface side of the semiconductor substrate 110A and evaluate the prototype. As a result, it is possible to evaluate the prototype at an earlier stage than a case where the prototype is evaluated after the CSP process. The workings and effects thereof will be described below.

An imaging device having a WLCSP structure is generally able to input and output a signal between an outside and a light receiving element from back surface side of a circuit board after the CSP process. Accordingly, it is difficult to perform evaluation prior to the CSP process even at a prototype stage. Thus, the imaging device having the WLCSP structure tends to have a longer development period and a longer prototype analysis period, i.e., lead time, than others. This prolonged lead time has a major impact on competitiveness of the product.

It is possible, however, for the imaging device having the WLCSP structure to be provided with an opening to be coupled to a pad electrode on front surface (light incident surface) side of the circuit board. This allows the pad electrode to be coupled to the light incident surface side of the circuit board prior to the CSP process and a prototype to be evaluated. However, the provision of the opening to be coupled to the pad electrode on the light incident surface side of the circuit board causes the chip size to be increased, and thus cost competitiveness is remarkably lowered. It may be possible to employ a method of providing the opening to be coupled to the pad electrode on the light incident surface side of the circuit board only at the prototype stage. However, this method causes a difference in configuration between the prototype and the mass-produced product to be increased, which causes a difference in wire capacitance or the like attributed to the difference in configuration, and an issue may occur in the mass-produced product.

In contrast, in the present embodiment, the extended wiring section 19 is provided in the multilayer wiring layer 110B in the peripheral area SA; therefore, it is possible to evaluated the prototype prior to the CSP process by coupling the test pad electrode 23 to the one end of the extended wiring section 19. Thus, it is possible to evaluate the prototype at an earlier stage and to reduce the lead time as compared to a case where the prototype is evaluated the prototype after going through the CSP process.

Further, the mass-produced imaging device 1 inputs and outputs a signal between the outside and the light receiving element 12 from the back surface side of the circuit board 11. Such an imaging device 1 eliminates the need for the opening to be coupled to the pad electrode on the light incident surface side of the circuit board 11. This makes it possible to reduce the chip size and enhance the cost competitiveness. Further, after trial manufacture, mass production is performed with one ends of the respective extended wiring sections 19 open, so that there is hardly any difference in configurations between the prototype and the mass-produced product. Therefore, it is possible to suppress occurrence of defects in the mass-produced products.

As described above, the imaging device 1 according to the present embodiment is provided with the extended wiring section 19 in the peripheral area SA, thereby making it possible to evaluate the prototype prior to the CSP process. Accordingly, it is possible to evaluate the prototype at an earlier stage than a case where the prototype is evaluated after going through the CSP process. Therefore, it is possible to reduce time required for evaluation of the prototype.

Further, in a mass-produced imaging device 1, a signal is inputted and outputted between the outside and the light receiving element 12 from the back surface side of the circuit board 11; therefore, it is possible to reduce the chip size and enhance the cost competitiveness. In addition, it is possible to reduce differences in the configurations between the prototype and the mass-produced product and to suppress the occurrence of defects in the mass-produced products.

In development of pixels of an imaging device, reduction in trial manufacture cycles is a key of development competitiveness. Therefore, the imaging device 1 is suitably used as an imaging device having a WLCSP structure that has a front-line pixel structure.

Hereinafter, a modification example of the above embodiment will be described, but in the following description, the same components as those of the above embodiment are denoted by the same reference numerals, and the description thereof will be omitted as appropriate.

Modification Example

FIG. 7 schematically illustrates a plane configuration around an input-output section IO of an imaging device (an imaging device 1A) according to a modification example of the above-described embodiment. In the imaging device 1A, a distance D2 between extended wiring sections 19 adjacent to each other is shorter than a distance D1 between through vias 11V adjacent to each other. Except for this point, the imaging device 1A has the same configuration as that of the imaging device 1 of the above embodiment, and the workings and effects thereof are also the same.

For example, portions of pad electrodes 15 are provided so as to extend from at or near the input-output section IO, for example, along a direction (Y direction in FIG. 7) in which the chip-peripheral guard ring CG extends. Provision of the extended wiring sections 19 in the extended portions of the pad electrodes 15 makes it possible to make the distance D2 between the extended wiring sections 19 adjacent to each other shorter than the distance D1 between the through vias 11V adjacent to each other. Therefore, it becomes possible to reduce an area of the test pad electrode 23 (FIG. 5) when evaluating the prototype.

The imaging device 1A is provided with, similarly to the above imaging device 1, the extended wiring section 19; therefore, it is possible to evaluate the prototype prior to the CSP process. In addition, it is possible to reduce the area of the test pad electrode 23 to be coupled to the extended wiring section 19 when the prototype is evaluated, which makes it possible to suppress an influence of the test pad electrode 23 on the imaging device 1A. For example, it becomes possible to suppress an interference between the test pad electrode 23 and a monitor element included in the imaging device 1A and an interference between the test pad electrode 23 and a mark to be used in a wafer process of the imaging device 1A.

Application Example

It is possible to apply the imaging devices 1 and 1A described above to various types of electronic apparatuses, such as a camera that is able to image light having a wavelength in the visible range. FIG. 8 illustrates a schematic configuration of an electronic apparatus 3 (camera). The electronic apparatus 3 is, for example, a camera that is able to capture a still image or a moving image, and includes the imaging device 1 or 1A, an optical system (optical lens) 310, a shutter device 311, a driver 313 that drives the imaging device 1 or 1A and the shutter device 311, and a signal processor 312.

The optical system 310 directs image light (incident light) from a subject to the imaging device 1 or 1A. The optical system 310 may include a plurality of optical lenses. The shutter device 311 controls a light irradiation period and a light shielding period on the imaging device 1 or 1A. The driver 313 controls a transferring operation of the imaging device 1 or 1A and a shuttering operation of the shutter device 311. The signal processor 312 performs various signal processes on a signal outputted from the imaging device 1 or 1A. An image signal Dout after a signal process is stored in a storage medium such as a memory or outputted to a monitor or the like.

[Example of Practical Application to In-Vivo Information Acquisition System]

Further, the technology (present technology) according to the present disclosure is applicable to various products. For example, the technology according to the present disclosure may be applied to an endoscopic surgery system.

FIG. 9 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 9, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

[Example of Practical Application to Endoscopic Surgery System]

The technology (present technology) according to the present disclosure is applicable to various products. For example, the technology according to the present disclosure may be applied to an endoscopic surgery system.

FIG. 10 is a view depicting an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 11 is a block diagram depicting an example of a functional configuration of the camera head 11102 and the CCU 11201 depicted in FIG. 10.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

[Example of Practical Application to Mobile Body]

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to the present disclosure is applicable. The technology according to the present disclosure may be applied to the imaging section 12031 of the configurations described above. Applying the technology according to the present disclosure to the imaging section 12031 makes it possible to obtain a captured image which is easier to see. Hence, it is possible to reduce the fatigue of the driver.

In addition to the above, the technology according to the present disclosure may also be applied to a smartphone or the like in addition to the above.

The present disclosure has been described above with reference to the embodiments, the modification examples, the application examples, and practical application examples; however, the present disclosure is not limited to the above-described embodiments, etc., and may be modified in a variety of ways. For example, the configurations of the imaging devices described in the above-described embodiments are merely exemplary, and may further include any other layer. Furthermore, the materials and thicknesses of the respective layers are merely exemplary as well, and are not limited to those described above.

Further, although the examples are indicated in the above embodiment and the like in which all of the conductive layers (the conductive layers M4, M5, M6, and 15A) included in the extended wiring section 19 are provided in the same layer as the conductive layer M4, M5, M6, and 15B of the wiring line 22, a portion of the conductive layer included in the extended wiring section 19 may be provided in the same layer as the conductive layers of the wiring line 22.

Further, although the cases are described in the above embodiment and the like in which the extended wiring section 19 includes the conductive layer M4, M5, M6, and 15A, and the wiring line 21 includes the conductive layers M1, M2, and M3, it is possible to freely design the configurations of the extended wiring section 19 and the wiring line 21. For example, the extended wiring section 19 may include the conductive layers M3, M4, M5, M6, and 15A, and the wiring line 21 may include the conductive layers M1 and M2. Alternatively, the extended wiring section 19 may include the conductive layers M5, M6, and 15A, and the wiring line 21 may include the conductive layers M1, M2, M3, and M4.

Further, as illustrated in FIG. 14, for example, the wiring line 21 may include the conductive layers M4, M5, M6, and 15B of the multilayer wiring layer 110B. That is, the conductive layers M4, M5, M6, and 15A included in the extended wiring section 19 may be provided in the same layer as the conductive layers of the wiring line 21.

It should be appreciated that the effects described herein are mere examples. The disclosure may include any effects other than those described herein, or may further include other effects in addition to those described herein.

It is to be noted that the present disclosure may have the following configurations.

(1)

An imaging device including:

a pixel area and a peripheral area that lies outside the pixel area;

a light receiving element provided in the pixel area;

a circuit board provided in the pixel area and the peripheral area, the circuit board including a semiconductor substrate and a multilayer wiring layer, the multilayer wiring layer being provided between the semiconductor substrate and the light receiving element;

a first wiring line provided in the multilayer wiring layer, the first wiring line being electrically coupled to the light receiving element;

a protective member that is opposed to the circuit board, the protective member and the circuit board sandwiching the light receiving element; and an extended wiring section provided between the semiconductor substrate and the protective member in the peripheral area, one end of the extended wiring section being open and another end of the extended wiring section being electrically coupled to the first wiring line.

(2)

The imaging device according to (1), further including an input-output section in the peripheral area of the circuit board, in which the extended wiring section is provided at or near the input-output section.

(3)

The imaging device according to (2), in which the input-output section includes a through electrode, and the extended wiring section is electrically coupled to the through electrode.

(4)

The imaging device according to (3), in which the imaging device is provided with a plurality of the extended wiring sections and a plurality of the through electrodes, and a distance between the extended wiring sections adjacent to each other is shorter than a distance between the through electrodes adjacent to each other.

(5)

The imaging device according to (3), in which the imaging device is provided with a plurality of the extended wiring sections and a plurality of the through electrodes, and a distance between the extended wiring sections adjacent to each other is substantially identical to a distance between the through electrodes adjacent to each other.

(6)

The imaging device according to any one of (1) to (5), in which the one end of the extended wiring section is provided at or near an edge of the circuit board.

(7)

The imaging device according to any one of (1) to (6), further including a guard ring provided in the peripheral area, in which the one end of the extended wiring section is disposed at a position closer to the pixel area than to the guard ring.

(8)

The imaging device according to any one of (1) to (7), in which the multilayer wiring layer includes a second wiring line electrically coupled to the light receiving element, and at least a portion of the extended wiring section includes a wiring layer provided in a layer identical to a layer in which the second wiring line is provided.

(9)

The imaging device according to any one of (1) to (8), further including a bonding section provided at a bonding surface between the light receiving element and the multilayer wiring layer, in which the bonding section includes a Cu—Cu bonding.

(10)

The imaging device according to (9), in which the extended wiring section includes the bonding section.

This application claims the benefit of Japanese Priority Patent Application JP2018-41954 filed with the Japan Patent Office on Mar. 8, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a pixel area;
a peripheral area that lies outside the pixel area;
a light receiving element in the pixel area;
a circuit board in the pixel area and the peripheral area, wherein
the circuit board includes a semiconductor substrate and a multilayer wiring layer, and
the multilayer wiring layer is between the semiconductor substrate and the light receiving element;
a first wiring line in the multilayer wiring layer, wherein the first wiring line is electrically coupled to the light receiving element;
a second wiring line in the multilayer wiring layer, wherein the second wiring line is electrically coupled to the light receiving element;
a protective member opposed to the circuit board, wherein the protective member and the circuit board sandwich the light receiving element; and
an extended wiring section between the semiconductor substrate and the protective member in the peripheral area, wherein
at least a portion of the extended wiring section includes a wiring layer in a layer in which the second wiring line is provided, and
one end of the extended wiring section is open and another end of the extended wiring section is electrically coupled to the first wiring line.

2. The imaging device according to claim 1, further comprising an input-output section in the peripheral area of the circuit board, wherein the extended wiring section is at or near the input-output section.

3. The imaging device according to claim 2, wherein
the input-output section includes a through electrode, and
the extended wiring section is electrically coupled to the through electrode.

4. The imaging device according to claim 3, wherein
the imaging device includes a plurality of extended wiring sections and a plurality of through electrodes,
the plurality of extended wiring sections includes the extended wiring section,
the plurality of through electrodes includes the through electrode,
a distance between a first extended wiring section of the plurality of extended wiring sections and a second extended wiring section of the plurality of extended wiring sections is shorter than a distance between a first through electrode of the plurality of through electrodes and a second through electrode of the plurality of through electrodes, the first extended wiring section is adjacent to the second extended wiring section and the first through electrode is adjacent to the second through electrode.

5. The imaging device according to claim 3, wherein the imaging device includes a plurality of extended wiring sections and a plurality of through electrodes, the plurality of extended wiring sections includes the extended wiring section, the plurality of through electrodes includes the through electrode, a distance between a first extended wiring section of the plurality of extended wiring sections and a second extended wiring section of the plurality of extended wiring sections is substantially identical to a distance between a first through electrode of the plurality of through electrodes and a second through electrode of the plurality of through electrodes, the first extended wiring section is adjacent to the second extended wiring section and the first through electrode is adjacent to the second through electrode each other.

6. The imaging device according to claim 1, wherein the one end of the extended wiring section is at or near an edge of the circuit board.

7. The imaging device according to claim 1, further comprising a guard ring in the peripheral area, wherein the one end of the extended wiring section is at a position closer to the pixel area than to the guard ring.

8. The imaging device according to claim 1, further comprising a bonding section at a bonding surface between the light receiving element and the multilayer wiring layer, wherein the bonding section includes a Cu—Cu bonding.

9. The imaging device according to claim 8, wherein the extended wiring section includes the bonding section.

* * * * *